(12) United States Patent
Miske et al.

(10) Patent No.: US 7,382,593 B2
(45) Date of Patent: Jun. 3, 2008

(54) METHOD OF LINEARIZING ESD CAPACITANCE

(76) Inventors: Myron Miske, 34 Finn Ave., Newfields, NH (US) 03856; David Morrill, 62 Mussey Rd., Scarborough, ME (US) 04074

( * ) Notice: Subject to any disclaimer, the term of this patent is extended or adjusted under 35 U.S.C. 154(b) by 133 days.

(21) Appl. No.: 11/226,020

(22) Filed: Sep. 14, 2005

(65) Prior Publication Data

US 2007/0058305 A1    Mar. 15, 2007

(51) Int. Cl.
*H02H 3/22* (2006.01)
(52) U.S. Cl. .......................... 361/56; 361/111
(58) Field of Classification Search ............ 361/56–58, 361/91.1, 111
See application file for complete search history.

(56) References Cited

U.S. PATENT DOCUMENTS

| | | | |
|---|---|---|---|
| 5,940,258 | A | 8/1999 | Duvvury |
| 6,317,305 | B1 * | 11/2001 | Dedic ........................... 361/56 |
| 6,501,632 | B1 | 12/2002 | Avery et al. |
| 6,690,066 | B1 | 2/2004 | Lin et al. |
| 6,747,501 | B2 * | 6/2004 | Ker et al. .................... 327/310 |

| | | | |
|---|---|---|---|
| 2002/0064007 | A1 | 5/2002 | Chang et al. |

FOREIGN PATENT DOCUMENTS

EP    0940852 A2    9/1999

OTHER PUBLICATIONS

Ming-Dou Ker et al, "Design and Analysis of the On-Chip ESD Protection Circuit with a Constant Input Capacitance for High-Precision Analog Applications", 2000 IEEE International Symposium on Circuits and Systems. Emerging Technologies for the 21st Century. May 31, 2000, pp. 61-64, vol. 5, Switzerland.
Richier C. et al, "Investigation on different ESD protection strategies devoted to 3.3V RF applications (2GHz) in a 0.18 mum CMOS process", Journal of Electrostatics, Jan. 2002, pp. 55-71, vol. 54, Amsterdam, Netherlands.
Lin J. et al, "A Fail-Safe ESD Protection Circuit with 230 fF Linear Capacitance for High-Speed/High-Precision 0.18 mum CMOS I/O Application", International Electron Devices Meeting 2002. IEDM. Technical Digest, Dec. 8, 2002, pp. 349-352, New York, NY.

* cited by examiner

*Primary Examiner*—Michael Sherry
*Assistant Examiner*—Danny Nguyen

(57) ABSTRACT

An ESD protection circuit for an input/output pad of an IC is disclosed with discharge paths to both a power rail and ground. The ESD circuit is arranged with NMOS and PMOS transistors arranged with their drains connected to the pad. However, the drain capacitances have voltage sensitivities that compensate or cancel each other, and with proper sizing the capacitance load on the pad can be made substantially constant over a given voltage range. By providing a discharge path to a power rail, the ESD circuit may be designed to be more tolerant of overvoltages on the power rail.

8 Claims, 2 Drawing Sheets

METHOD OF LINEARIZING ESD CAPACITANCE

BACKGROUND OF THE INVENTION

1. Field of the Invention

The present invention relates to electrostatic discharge (ESD) protection circuitry for an IC (integrated circuit) input, and more particularly to controlling the load capacitance of the protection circuitry on the input.

2. Background Information

Integrated circuits are susceptible to and may be destroyed by ESD pulses. It is known that such ESD pulses may emanate from several sources, one primary source being from a human touching the IC. But, other sources may produce destructive ESD events. Such ESD pulses may include thousands of voltage and amperes of current that exist for a hundred nanoseconds or so. ESD events (defined as discharges or pulses) typically drive current into the IC, but may also sink current from the IC. Protection from both types is provided.

Protection devices and circuits have been developed over a number of years that have provided reliable protection. Some of these protective circuits use voltage limiting devices that discharge the ESD pulse before the pulse travels into the IC. U.S. Pat. No. 5,940,258('258) illustrates a protection circuit that is functionally reproduced in FIG. 1.

In FIG. 1 a positive going ESD pulse occurring on the pad 1 is capacitively coupled 4 to the gates of NMOS transistors Q1 and Q2 that share a common substrate. Q2 is smaller than Q1 and turns on quicker and produces a voltage across R1 and the common substrate. This substrate voltage helps Q1 turn on more fully, thereby discharging the ESD pulse.

However, a limitation of the '258 circuit and other prior art ESD protection circuits is that the circuits introduce a load capacitance on the pad that is sensitive to input voltage level. This sensitivity distorts an input signal and diminishes circuit performance.

Another prior art circuit is shown in U.S. Pat. No. 6,690,066. This patent improves upon the '258 patent by introducing a diode, D1, between the drain of Q1 and the pad of FIG. 1. The diode D1 isolates and minimizes the drain capacitance of Q1 with respect to the pad, and, importantly, the diode capacitance has a positive voltage coefficient that may be used to counter the negative voltage capacitance coefficient of Q1 and Q2. In this manner the capacitance load on the pad 2 may be made more constant and less sensitive to changing input signal voltages.

The '066 patent is directed to linearizing the ESD circuit capacitance, but does so with circuits that are only referenced to ground. The present invention linearizes the ESd capacitance while providing an ESd protection discharge path to both the power rail and to ground. The parallel paths improve ESD protection when, for example, the ground is path is insufficient to discharge the ESD pulse. Moreover, having the present inventive ESD circuit referenced to Vcc allows it to be designed more tolerant of overvoltages on the power rail.

Typical IC circuits lie between a power rail and ground, but, as known to those skilled in the art, a circuit may lie between two voltage levels, the higher may be designated as Vdd and the lower as Vss. In this disclosure, Vcc represents the higher voltage level and ground represents the lower voltage level.

SUMMARY OF THE INVENTION

The present invention provides an ESD protection circuit to both ground, Vss, and a power rail, Vcc. In a preferred embodiment, the protection device to ground is an NMOS with its drain connected to the pad being protected. An NMOS has a negative voltage coefficient of drain capacitance. In this embodiment, the protection device to the power rail is a PMOS with its drain connected to the pad. A PMOS has a positive voltage coefficient of drain capacitance. The sizing of the P and N MOS transistors allows the designer to balance the drain capacitance of the NMOS with the PMOS to make the combination capacitances substantially insensitive or constant over a range of voltages. In addition, the pad is protected to both ground and to the power rail thereby providing the reliability of redundant paths. This is advantageous when neither the ground nor the power rail is adequate for discharging the ESD event.

An additional advantage of having protection to both ground and the power rail is that the circuits may be designed with a tolerance to voltage variations on the power rail. Most typical of such variations are overvoltages.

The present inventive circuit and method connects components to a pad to protect any circuitry connected to that pad from a destructive ESD pulse. The inventive circuit connects to the pad, however as known to those skilled in the art, the connections may be "functional," in that other components may be added between "connecting" points that do not change in any meaningful way to the operation of the present inventive circuit and method.

It will be appreciated by those skilled in the art that although the following Detailed Description will proceed with reference being made to illustrative embodiments, the drawings, and methods of use, the present invention is not intended to be limited to these embodiments and methods of use. Rather, the present invention is of broad scope and is intended to be defined as only set forth in the accompanying claims.

BRIEF DESCRIPTION OF THE DRAWINGS

The invention description below refers to the accompanying drawings, of which.

DETAILED DESCRIPTION OF AN ILLUSTRATIVE EMBODIMENT

Figure 1:
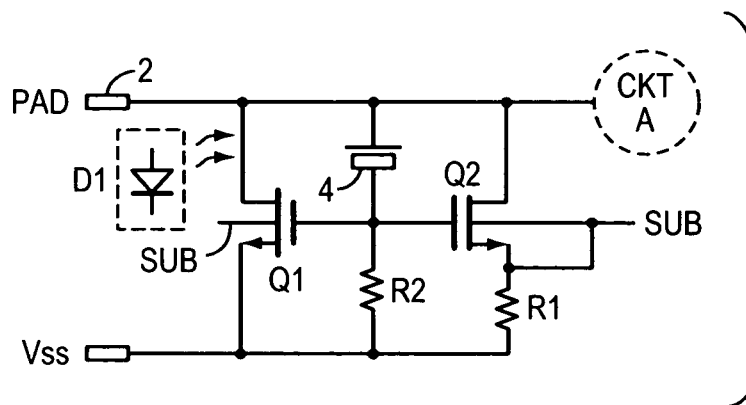
FIG. 1 is a functional schematic of prior art ESD circuits.
Figure 2:
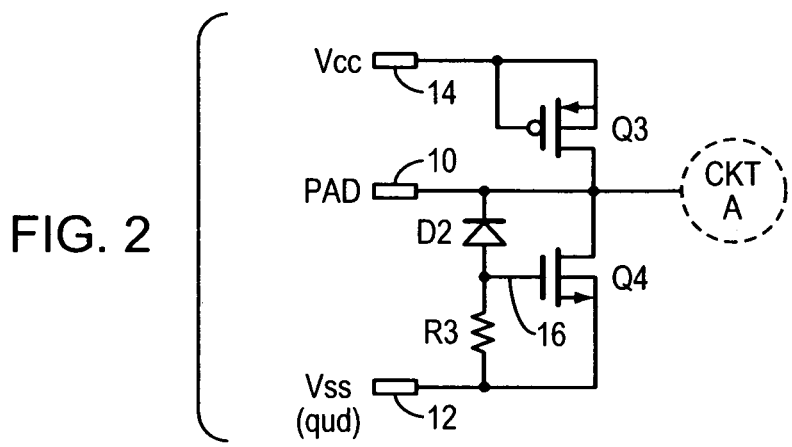
FIG. 2 is a schematic illustrating an embodiment of the present invention.

FIG. 2 illustrates a ESD protective circuit connected to the pad 10 for protecting the circuit CKT A from an ESD pulse that might appear on the pad. The approach is to dissipate or discharge the ESD pulse appearing at the pad 10 directly to ground 12 and/or Vcc 14 with little or no high voltage or current spikes entering CKT A. Importantly, concurrent with the ESD protection, the load capacitance of the protection circuit is made substantially constant with the input signal voltage on the pad 10.

With respect to ESD protection, the diode D2 is reverse biased establishing a capacitive path from the pad 10 to the gate 16 of Q4. A rising ESD pulse is coupled to the gate 16 turning on Q4 thereby discharging the ESD pulse. In another preferred embodiment, the techniques described and taught in the '066 and the '258 patents, where NMOS transistors share the same substrate and one drives the substrate whereby the second turns on more fully, may be implemented within the present invention as a discharge path from a pad to ground.

However, FIG. 2 includes Q3, a PMOS, connecting the pad 10 to the power rail 14. Q3 is connected to exhibit the well known diode connection with its anode at the pad 10 and its cathode at the power rail 14. A positive going ESD pulse at the pad 10 will turn on the body diode of Q3 and discharge the ESD pulse to the power rail. So there will be a simultaneous discharge of a positive ESD pulse via Q3 and Q4. Since there is also a body diode associated with Q4, a negative ESD pulse will discharge to ground via this body diode.

As mentioned above, if a signal, especially an analog signal, appears on the pad 10 but the capacitance load on the pad 10 changes with signal level, the signal will be distorted or otherwise compromised, and, obviously, higher frequency signals will be more affected. The circuit of FIG. 2 presents a capacitive load on the pad 10 comprised of the diode D2 and the drains of Q3 and Q4. Often, the capacitance of D1 and Q4 will have a negative voltage coefficient while Q3 will have positive coefficient. Making the sizes and the physical characteristics of these structures, as will be known to those skilled in the art of makings such devices, the capacitive values of D1, Q4 and Q3 can be designed to remain substantially constant over a range of input voltages.

Figure 3:
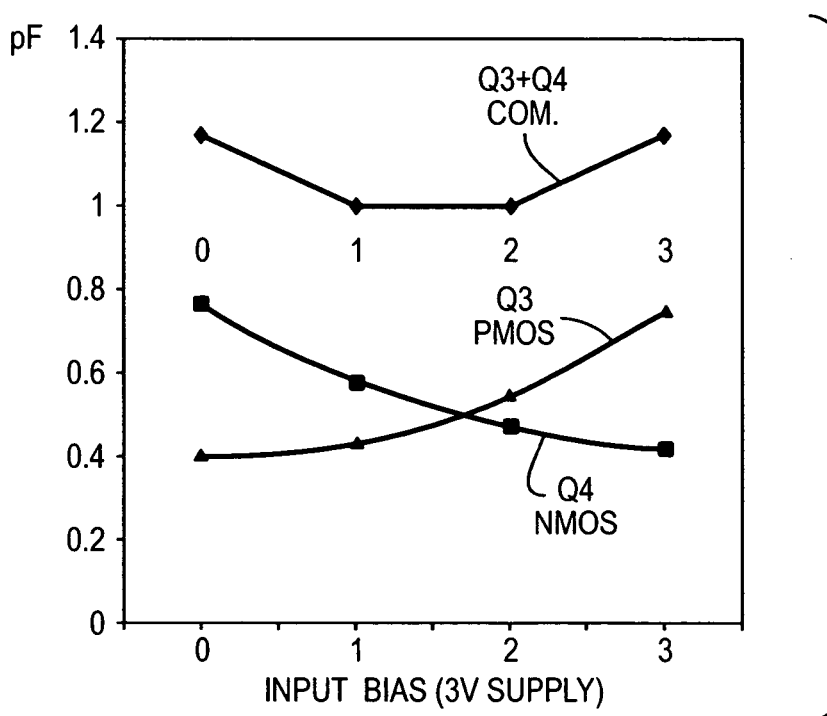
FIG. 3 is a graph illustrating the effect of the present invention on input capacitance.

FIG. 3 shows one sizing of the components that achieve a constant capacitive load on the pad 10 between input voltage levels of 1 to 2 volts. The diode D1 is factored into of these graphs but not shown. Resizing the components will allow the designer to offer linear capacitances over different input voltage biases.

Figure 4:
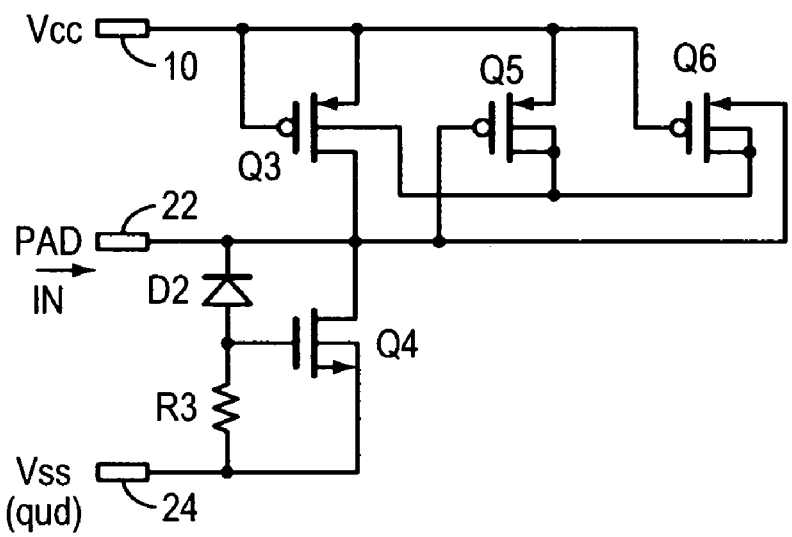
FIG. 4 is a schematic of another preferred embodiment of the present invention.
Figure 5:
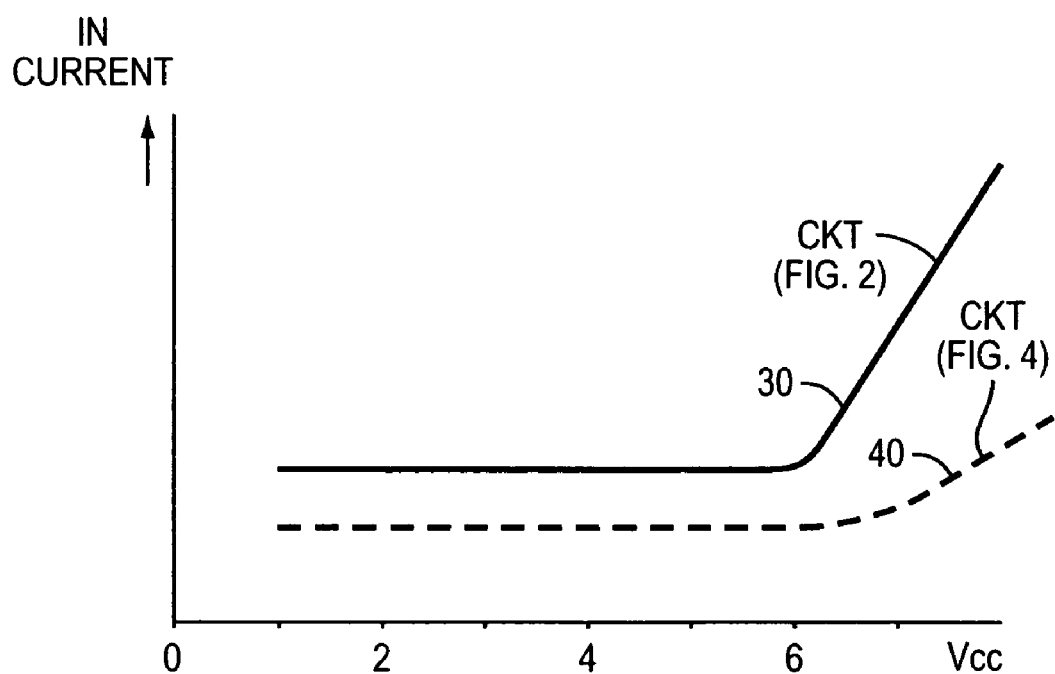
FIG. 5 is a graph of input current versus Vcc voltage.

FIG. 4 illustrates another preferred embodiment, where the ESD circuit is tolerant of overvoltages on the Vcc 20 line. FIG. 5 shows the IN current on the pad 22 as Vcc exceed plus six volts. The trace 30 for the circuit of FIG. 2 shows a markedly increased IN current compared to the trace 40 for the circuit of FIG. 4.

FIG. 4 adds to the circuit of FIG. 2 two additional PMOS transistors between the pad 22 and Vcc as shown. When Vcc rises, Q5 will turn on biasing the substrate of Q3 and the substrate and drain of Q6 higher preventing parasitic transistors from turning on. Also, when Vcc lowers below the pad 22 voltage level, Q6 will turn on driving the substrates of Q3 and Q5 higher preventing Q3 and Q5 from turning on.

It should be understood that above-described embodiments are being presented herein as examples and that many variations and alternatives thereof are possible. Accordingly, the present invention should be viewed broadly as being defined only as set forth in the hereinafter appended claims.

What is claimed is:

1. A method for linearizing the capacitance of an ESD protection circuit with respect to voltage, the method comprising the steps of:
    providing a first discharge path to ground via a drain of an NMOS transistor disposed between the pad and ground;
    transferring at least part of a positive ESD pulse at the pad to the gate of the NMOS thereby turning on the NMOS;
    providing a second discharge path via a drain of a PMOS transistor disposed between the pad and a positive power rail, wherein the PMOS gate is connected to its source to form a diode connected PMOS with its anode at the pad and its cathode at the power rail, and wherein a positive ESD pulse at the pad turns on the diode connected PMOS, so that a positive ESD pulse is discharged simultaneously through both the first and the second discharge paths, the NMOS and the diode connected PMOS, respectively, and wherein the drain of the NMOS and the drain of the PMOS have capacitance sensitivities with respect to voltage that compensate for each other; and
    functionally connecting the drain and the substrate of the second PMOS to the substrate of the PMOS; wherein the operation of the second PMOS prevents parasitic transistors in the PMOS from turning on when the positive power rail experiences a rising voltage, and further comprising the step of sizing the NMOS and PMOS transistors so that the voltage sensitivities of the PMOS and the NMOS drain capacitances compensate for each other.

2. The method of claim 1 wherein the step of providing a first discharge path comprises the steps of:
    functionally connecting the drain of an NMOS transistor to the pad;
    functionally connecting the source of the NMOS transistor to ground;
    transferring at least a portion of the ESD pulse to the gate of the NMOS transistor, and wherein the step of providing a second discharge path comprises the steps of:
    functionally connecting the drain of a PMOS transistor to the pad;
    functionally connecting the gate and source of the PMOS to a positive power rail,
    functionally connecting the pad to the date of a second PMOS;
    functionally connecting the source of the second PMOS to the positive power rail;
    functionally connecting the drain and the substrate of the second PMOS to the substrate of the PMOS; wherein the operation of the second PMOS prevents parasitic transistors in the PMOS from turning on when the posivitive power rail experiences a rising voltage, and further comprising the step of sizing the NMOS and PMOS transistors so that the voltage sensitivities of the PMOS and the NMOS drain capacitances compensate for each other.

3. The method of claim 2 further wherein the step of transferring is accomplished via a capacitor.

4. The method of claim 2 further comprising the steps of:
    functionally connecting the gate of the third PMOS to the positive power rail; and
    functionally connecting the drains and substrate of the third PMOS to the substrate of the PMOS, and wherein the sizing of the NMOS and PMOS transistors compensates for the voltage sensitivities of their drain capacitances, whereby the ESD circuit contributes a capacitance to the pad that is substantially constant, and wherein an input current in the pad is tolerant of overvoltages on the power rail.

5. An ESD circuit comprising:
    a first discharge path to ground via a drain of an NMOS transistor disposed between the pad and ground;
    a capacitor element constructed from the pad to the gate of the NMOS transistor, wherein a positive going pulse at the pad is transferred to the gate of the NMOS turning on the NMOS;
    a second discharge path via a drain of a diode connected PMOS transistor disposed between the pad and a positive power rail, with its anode at the pad and its cathode at the positive power rail, wherein a positive going ESD pulse at the pad is discharged simultaneously through the first and the second discharge paths, and wherein the drain of the NMOS and the drain of the PMOS have capacitance sensitivities with respect to voltage that compensate for each other;

a second PMOS with its gate connected to the pad and its drain and substrate connected to the substrate of the PMOS and the second PMOS source connected to the positive power rail, wherein the operation of the second PMOS prevents parasitic transistors in the PMOS from turning on when the positive power rail experiences a rising voltage; and wherein the NMOS and PMOS transistors are sized so that the voltage sensitivities of the PMOS and the NMOS drain capacitances cancel each other.

6. The ESD circuit of claim 5 wherein the first discharge path comprises:

an NMOS transistor with its drain functionally connected to the pad, its source and substrate connected to or in communication with ground; and a signal path from the pad to the gate of the NMOS, wherein a positive going ESD pulse at the pad turns on the NMOS transistor, and wherein the second discharge path comprises:

a PMOS transistor with its drain functionally connected to the pad, its source and gate functionally connected to a positive power rail;

a second PMOS with its gate connected to the pad and its drain and substrate connected to the substrate of the PMOS and the second PMOS source connected to the positive power rail, wherein the operation of the second PMOS prevents parasitic transistors in the PMOS from turning on when the posivitive power rail experiences a rising voltage, and wherein the NMOS and PMOS transistors are sized so that the voltage sensitivities of the PMOS and the NMOS drain capacitances cancel each other.

7. The circuit of claim 6 further wherein the signal path is a reverse biased diode structure.

8. The circuit of claim 6 further comprising:

a third PMOS with its source functionally connected to the pad, its gate functionally connected to the positive power rail, and its drain and substrate functionally connected to the substrate of the PMOS, and wherein the sizing of the NMOS and the three PMOS transistors are arranged to cancel the combined voltage sensitivities of their drain capacitance, and wherein the inventive circuit is tolerant of overvoltages on the power rail.

* * * * *

UNITED STATES PATENT AND TRADEMARK OFFICE
CERTIFICATE OF CORRECTION

PATENT NO. : 7,382,593 B2
APPLICATION NO. : 11/226020
DATED : June 3, 2008
INVENTOR(S) : Myron J. Miske et al.

It is certified that error appears in the above-identified patent and that said Letters Patent is hereby corrected as shown below:

Title page, item [73] should read as follows:

Assignee: Fairchild Semiconductor Corporation
82 Running Hill Road
South Portland, ME 04106

At Col. 1, Line 17, please correct as shown:
include thousands of ~~voltage~~ volts and amperes of current that At Col. 3, Line 34, please correct as shown:
~~of~~ these graphs but not shown. Resizing the components will Signed and Sealed this Third Day of March, 2009

JOHN DOLL
*Acting Director of the United States Patent and Trademark Office*